United States Patent
George et al.

(10) Patent No.: US 11,850,791 B2
(45) Date of Patent: Dec. 26, 2023

(54) PRINTING DEVICES

(71) Applicant: Hewlett-Packard Development Company, L.P., Houston, TX (US)

(72) Inventors: David George, Palo Alto, CA (US); Chandrakant Patel, Palo Alto, CA (US); Lihua Zhao, Palo Alto, CA (US); Michael Renne Ty Tan, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 1318 days.

(21) Appl. No.: 15/764,765

(22) PCT Filed: Jan. 20, 2016

(86) PCT No.: PCT/US2016/014025
§ 371 (c)(1),
(2) Date: Mar. 29, 2018

(87) PCT Pub. No.: WO2017/127061
PCT Pub. Date: Jul. 27, 2017

(65) Prior Publication Data
US 2018/0281278 A1 Oct. 4, 2018

(51) Int. Cl.
*B29C 64/153* (2017.01)
*B33Y 30/00* (2015.01)
(Continued)

(52) U.S. Cl.
CPC .......... *B29C 64/153* (2017.08); *B29C 64/165* (2017.08); *B29C 64/264* (2017.08);
(Continued)

(58) Field of Classification Search
CPC ... B29C 64/153; B29C 64/264; B29C 64/393; B29C 64/277; B29C 64/165; B33Y 10/00; B33Y 30/00; B33Y 50/02; H01S 5/18355
See application file for complete search history.

(56) References Cited

U.S. PATENT DOCUMENTS 10,328,633 B2 * 6/2019 Yamazaki ............ B29C 64/112
2006/0198916 A1 9/2006 Beeck et al.
(Continued)

FOREIGN PATENT DOCUMENTS

WO WO-2013024297 2/2013
WO WO-2014-199149 A1 12/2014
(Continued)

OTHER PUBLICATIONS

Doubrovski, E. L. et al.; N/A Dec. 2, 2014 Voxel-based Fabrication through Material Property Mapping: a Design Method for Bitmap Printing.

*Primary Examiner* — Alison L Hindenlang
*Assistant Examiner* — Shibin Liang
(74) *Attorney, Agent, or Firm* — SHOOK, HARDY & BACON L.L.P.

(57) ABSTRACT

In one example, a device for printing a three-dimensional object is described. The device may include at least one material application unit to deposit at least one material for a voxel of the three-dimensional object, a vertical cavity surface emitting laser array comprising a plurality of vertical cavity surface emitting lasers, the plurality of vertical cavity surface emitting lasers including a first vertical cavity surface emitting laser to operate at a first wavelength and a second vertical cavity surface emitting laser to operate at a second wavelength, and a processor to control a deposition of the at least one material for the voxel via the at least one material application unit and to control an application of electromagnetic energy via at least one of the plurality of vertical cavity surface emitting lasers to the voxel to alter at least one property of the at least one material.

20 Claims, 5 Drawing Sheets

(51) Int. Cl.

| | | |
|---|---|---|
| *B33Y 50/02* | (2015.01) | |
| *B33Y 10/00* | (2015.01) | |
| *B29C 64/393* | (2017.01) | |
| *B29C 64/165* | (2017.01) | |
| *B29C 64/277* | (2017.01) | |
| *B29C 64/264* | (2017.01) | |
| *H01S 5/183* | (2006.01) | |

(52) U.S. Cl.
CPC .......... *B29C 64/277* (2017.08); *B29C 64/393* (2017.08); *B33Y 10/00* (2014.12); *B33Y 30/00* (2014.12); *B33Y 50/02* (2014.12); *H01S 5/18355* (2013.01)

(56) References Cited

U.S. PATENT DOCUMENTS

| | | |
|---|---|---|
| 2011/0195237 A1 | 8/2011 | Patel et al. |
| 2011/0222081 A1 | 9/2011 | Yi et al. |
| 2015/0004045 A1 | 1/2015 | Ljungblad |
| 2015/0165556 A1 | 6/2015 | Jones et al. |
| 2015/0273763 A1 | 10/2015 | Okamoto |
| 2016/0151973 A1* | 6/2016 | Juan Jover ............ B29C 64/393 264/462 |
| 2016/0279707 A1* | 9/2016 | Mattes .................... B29C 64/20 |

FOREIGN PATENT DOCUMENTS

| | | |
|---|---|---|
| WO | WO-2015-091485 A1 | 6/2015 |
| WO | WO-2015-106832 A1 | 7/2015 |
| WO | WO-2015179572 A1 | 11/2015 |

\* cited by examiner

PRINTING DEVICES

BACKGROUND

In additive manufacturing technology, or three-dimensional printing, objects are built from selective addition of material rather than by molding or by subtractive machining, where material is removed by cutting and grinding. Candidates for three-dimensional printing include the functional and aesthetic components of machines, prototypes, and consumer and industrial products that are produced in short runs, customized, or that may be one-of-a-kind.

DETAILED DESCRIPTION

Figure 1:
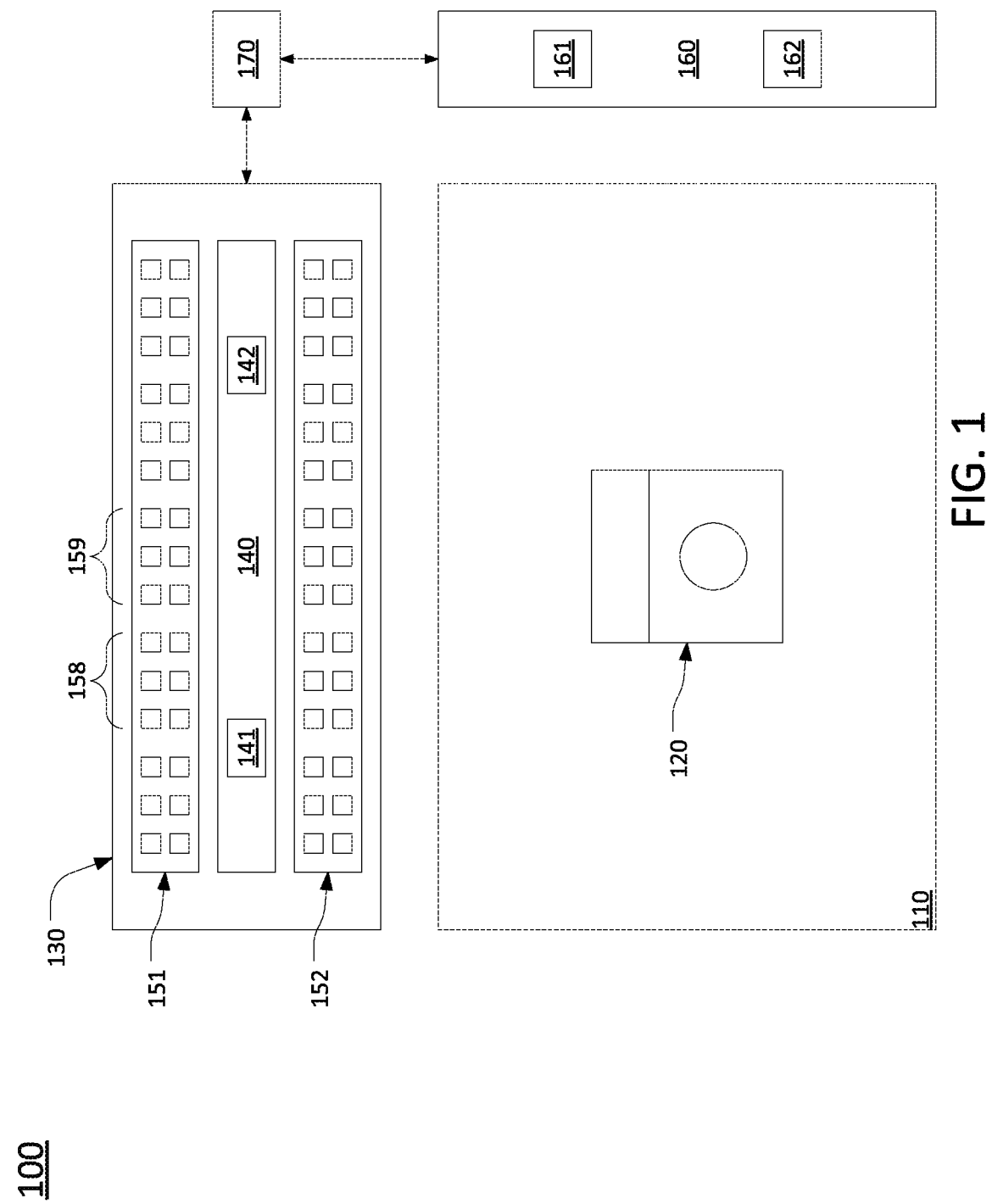
FIG. 1 illustrates a simplified diagram of an example printing device of the present disclosure.

In one example, a device for printing a three-dimensional object is described. The device may include at least one material application unit to deposit at least one material for a voxel of the three-dimensional object, a vertical cavity surface emitting laser array comprising a plurality of vertical cavity surface emitting lasers, the plurality of vertical cavity surface emitting lasers including a first vertical cavity surface emitting laser to operate at a first wavelength and a second vertical cavity surface emitting laser to operate at a second wavelength, and a processor to control a deposition of the at least one material for the voxel via the at least one material application unit and to control an application of electromagnetic energy via at least one of the plurality of vertical cavity surface emitting lasers to the voxel to alter at least one property of the at least one material.

In another example, a method of printing a three-dimensional object is described. The method may include a printing device receiving instructions for printing the three-dimensional object, the instructions including at least one material for a voxel of the three-dimensional object, and at least a first intensity of electromagnetic energy of at least a first wavelength to apply to the voxel, depositing the at least one material for the voxel via at least one material application unit, and applying the electromagnetic energy of the at least the first intensity and of the at least the first wavelength to the at least one material for the voxel via at least a first vertical cavity surface emitting laser of a plurality of vertical cavity surface emitting lasers to alter at least one property of the at least one material for the voxel, where the plurality of vertical cavity surface emitting lasers includes at least a second vertical cavity surface emitting laser to emit electromagnetic energy at a second wavelength.

In another example, a non-transitory computer-readable medium storing instructions for a processor is described. For example, the non-transitory computer-readable medium may store instructions which, when executed by the processor, cause the processor to receive parameters for rendering a three-dimensional object, the parameters including at least one property of a first region of the three-dimensional object, and at least one property of a second region of the three-dimensional object, the first region including at least a first voxel and the second region including at least a second voxel, calculate an intensity and a wavelength of electromagnetic energy to apply to the at least the first voxel via a plurality of vertical cavity surface emitting lasers of a printing device based upon the at least one property of the first region and based upon at least one material for the first voxel, calculate an intensity and a wavelength of electromagnetic energy to apply to the at least the second voxel via the plurality of vertical cavity surface emitting lasers based upon the at least one property of the second region and based upon at least one material for the second voxel, and generate instructions for rendering the three-dimensional object, the instructions including the intensity and the wavelength of electromagnetic energy to apply to the at least the first voxel and the intensity and the wavelength of electromagnetic energy to apply to the at least the second voxel.

As referred to herein, a printing device may comprise an additive manufacturing device, e.g., based on jet dispensing, for printing or fabricating a three-dimensional object. As referred to herein, a voxel, or volumetric pixel, comprises the smallest three-dimensional unit that may be used to create a larger three-dimensional object. For instance, in one example of the present disclosure a distance between a center of a first voxel and a center of an adjacent voxel may be approximately 20 microns or less. In one example, the distance may be 10 microns or less.

In one example of the present disclosure a printing device may include an array of vertical cavity surface emitting lasers (VCSELs) to apply specific wavelengths or combinations of wavelengths of electromagnetic energy, e.g., from infrared to ultraviolet, in varying levels of intensity and duration, onto each voxel of each layer of a three-dimensional object as each layer is added by the printing device. Whereas the goal of general illumination is a generally consistent material property for an object, controlled VCSEL illumination offers the opportunity to create intentional non-uniformity, resulting in the ability to create different regions of one or more voxels with varying physical properties in a single three-dimensional printed object. For example, by varying the characteristics of electromagnetic energy applied by an array of VCSELs, the type and degree of transformation and the resulting change to the material at each voxel can be precisely manipulated, resulting in the ability to design various material states into small or complex-shaped local volumes within the three-dimensional printed object. Voxel level control over the wavelengths, duration, and intensity of electromagnetic energy applied by a VCSEL array may also be combined with other techniques such as locally deposited agent materials, or functional agents, to expand the range of properties which can be purposefully and deliberately manipulated for each voxel. For instance, chemical-driven changes, electromagnetic energy driven changes, and the combinations and interrelations of both are available for achievement of differentiable characteristics at the voxel level. Characteristics impacted may include material or physical properties, or visible properties, such as: texture, porosity, rigidity, pliability, elasticity, strength, translucence, opacity, reflectivity, intensity, conductivity, and chromaticity.

Variable processing from voxel to voxel may be used to produce fine gradations of material change across a volume, abrupt changes along a determined boundary within the volume of the three-dimensional object, or other patterns within the volume. For instance, a certain pattern of repeating lines where electromagnetic energy of a first wavelength is applied and where electromagnetic energy of a second different wavelength is applied may be used to create a region of the object with a certain pliability, whereas a uniform application of the same wavelength and intensity of electromagnetic energy to all voxels in the region may result a more rigid, or more pliable region. Different wavelengths and intensities of electromagnetic energy from the VCSELs may also be applied to create visual patterns, such as regions with greater reflectivity, opacity, etc. In addition, jagged lines, angles, shapes within shapes, and the like may be created by differential application of electromagnetic energy by the VCSELs. For instance, a soft pliable object may be created with a more rigid frame in the center. In another example, an opaque center may be surrounded by a translucent outer region. Other patterns and designs of a same or a similar nature may be provided through examples of the present disclosure.

In addition, with general illumination, agent materials may be inefficiently utilized to account for responses to a wide spectrum of wavelengths. In contrast, examples of the present disclosure may select one or more wavelengths of electromagnetic energy from a set of wavelengths that are provided by an array of VCSELs, where the wavelength(s) selected may be tuned to optimize the effectiveness of one or more agent materials. For example, a voxel may be created from a substrate material (which may comprise one or more base or component materials), such as a nylon or other thermoplastic. For example, the substrate may comprise a polyacrylate, a polymethacrylate, a polystyrene, an acrylonitrile butadiene styrene, a polyamide, a polycarbonate, a polyvinyl or a polyurethane. An agent material may also be applied, such as colorant dye, a dye for edge effects, a cross-linker, a photoinitiator, and so forth. For example, some agent materials acting as catalysts or promoters help to fix the substrate material in a certain form when exposed to infrared or ultraviolet radiation. While some of the agent materials may perform as intended over a broad spectrum of wavelengths or those wavelengths associated with a single fixed source of energy, such as a halogen lamp or an infrared lamp, at least a portion of the agent materials may work best or most efficiently within a narrower band or at a particular wavelength that is not associated with such fixed sources of energy. Thus, in accordance with the present disclosure particular wavelengths of electromagnetic energy may be selected for application by VCSELs available in a printing device which may be tailored to the particular type of agent materials that may be used and the desired properties of one or more voxels or regions of a three-dimensional object to be created, thereby greatly expanding the range of chemistries and agents that are available to the chemist or printer to be used to manipulate the properties of the object. With voxel level control, the application of different wavelengths, intensities and durations of application of electromagnetic energy from a VCSEL array can also be adjusted to compensate for edge effects and other issues, such as reflectivity or energy absorption of surrounding material that would otherwise create non-uniform results under general illumination.

In one example, a VCSEL array, or bar, is mounted to a carrier that may traverse the surface of a work area of a printing device, or which may extend across the surface of the work area. In one example the VCSEL array may have a controlled vertical travel system, so that a small and well defined distance between the VCSELs and the illuminated surface of the three-dimensional object is maintained. For example, the distance may be determined by the focal depth of the VCSELs, with the distance held constant as the object is built layer by layer in the printing device. The VCSEL array may include one or more types of VCSELs with static or adjustable wavelengths of electromagnetic energy emission. The more wavelengths that are provided by the VCSELs, the greater the number of additional variables are available to control the resulting properties of a voxel or region of the object, and the greater the number of different resulting properties are achievable. VCSELs in a VCSEL array may be controlled individually or in groups using a VCSEL controller, or circuit. The resolution of the VCSELs may determine the smallest area of differentiable illumination available. In one example, the resolution of the VCSELs may match or exceed the material resolution of the printing device. For instance, the material resolution may comprise a smallest incrementally addable three-dimensional unit (e.g., a voxel size) on the order of 20 microns, whereas the VCSEL resolution may be approximately 10 microns.

In one example, the properties or the processing of an individual voxel may be described by a vector. For example, vector components may include quantities of specific types of substrate materials available to be mixed, quantities of functional agents to be added, or other factors. In addition, wavelengths of electromagnetic energy may be additional vector components, in which, for each wavelength, an intensity of the radiation may comprise the magnitude of the vector component associated with the wavelength. Alternatively, or in addition, a duration of application of the electromagnetic energy of the selected wavelength may comprise a further vector component. The vector components may be translated into instructions for various VCSELs to be activated to apply various wavelengths of electromagnetic energy at various intensities and durations to a voxel simultaneously or in a sequence, to achieve varying effects. For example, changing the radiation characteristics to be applied via a VCSEL array may impact the texture, rigidity, flexibility, durability under environmental stress, appearance, strength, and other qualities of the physical material(s) that are deposited for a voxel, or a region of voxels. For instance, in one example, ultraviolet (UV) radiation may be used for curing, while infrared (IR) radiation may be used for heating or fusing, visible light may be used for other purpose, and so on. Thus, rather than non-uniformity being an unintentional effect to be designed out, the non-uniformity may comprise a design feature.

For instance, a pattern of reflective and non-reflective stripes may be repeated across a surface of the object, two stiff regions with a pliable region between the two stiff regions may create an object where bending is more confined to the pliable region, an opaque central region of an object may be surrounded by translucent surrounding region, and so forth. These example visual or material patterns may all be achieved via the selection by the controller of the wavelengths of electromagnetic energy that are applied (or not applied) to each voxel, and throughout different regions of the object comprised of a plurality of voxels, as well as the durations and intensities at which the different the wavelengths of electromagnetic energy are applied. These and other aspects of the present disclosure are described in greater detail below in connection with the example FIGS. 1-5.

FIG. 1 illustrates one example of a printing device 100 in which examples of the present disclosure may be implemented. For example, as shown in FIG. 1, printing device 100 includes a work area 110, a controller 170, a first carriage 130, and a second carriage 160. The first carriage 130 may include a material water 140 and two VCSEL arrays 151 and 152. In one example, the first carriage may be referred to as a curing bar. The second carriage 160 may be for applying one or more functional agents. As illustrated in FIG. 1, a three-dimensional object 120 may be in the process of being printed/fabricated in the work area 110. In one example, controller 170 may receive data from and send instructions to other components of printing device 100. In one example, controller 170 may take the form of a computing device 500 of FIG. 5, as further discussed below.

In one example, printing device 100 may build object 120 as follows. Initially, the first carriage 130 may pass over the work area 110. A layer of substrate material may be deposited in the work area 110 by the material water 140 during the pass. The substrate material may be obtained from one or more storage units, e.g., storage units 141 and 142, attached to or integrated with the material coater 140 and/or the first carriage 130. In one example, the substrate material may comprise a mixture of two or more base materials. For instance, storage unit 141 may store a first base material and storage unit 142 may store a second base material which may be used individually or as a mixture for any of the voxels of the object 120. The second carriage 160 may then pass over the work area 110 and deposit one or more functional agents in selected areas of the substrate material. For instance, the controller 170 may provide instructions for the second carriage 160 to apply one or more functional materials to certain voxels, or regions of voxels in the layer. In one example, the functional material(s) may be obtained from one or more storage units, e.g., storage units 161 and 162, attached to or integrated with the second carriage 160. Next, the first carriage 130 may again pass over the work area 110. Electromagnetic energy may be applied via one of the VCSEL arrays 151 or 152 to certain voxels, or regions of voxels in the layer. For instance, the controller 170 may provide instructions for the VCSEL array 151 or 152 to apply zero, on or more than one wavelength of electromagnetic energy for each voxel in the layer. In one example, the instructions may further specify an intensity and/or duration of application of the electromagnetic energy at each of the one or more wavelengths for various voxels in the layer. In the same pass of the first carriage 130 over the work area 110, the material coater 140 may apply a next layer of substrate material. For instance, a VCSEL array 151 or 152 that precedes the material coater 140 in a direction of movement of the first carriage 130 during the pass may be used for the application of electromagnetic energy. Thus, voxels of the current layer of the object 120 may receive the application of electromagnetic energy (if applicable) by the VCSEL array 151 or 152, followed by the deposition of additional substrate material for the next layer by the material coater 140. The second carriage 160 may again pass over the work area 110 and apply functional material(s) to voxels or regions of voxels in the next layer of the object 120 according to instructions from controller 170. This may be further followed by another pass of the first carriage 130 to apply electromagnetic energy via one of the VCSEL arrays 151 or 152 and to deposit substrate material for a next layer via material coater 140, and so on.

In one example, the substrate material applied by the material coater 140 may comprise a thermoplastic, a thermoset, a polymer, a metal, and so forth. For instance, the substrate material may comprise a polyacrylate, a polymethacrylate, a polystyrene, an acrylonitrile butadiene styrene, a polyamide, e.g., nylon, a polycarbonate, a polyvinyl, a polyurethane, compounds or mixtures of such materials, and the like. In one example, the substrate material may be applied in the form of pellets, powder, a gel, and so forth. In one example, the agent material(s) applied by the second carriage 160 may comprise one or more fusing agents or detailing agents. For instance, agent materials applied by the second carriage 160 may include a dye, e.g., a colorant dye, or a dye for photon absorption and edge effects, a cross-linker, a plasticizer, a photoinitiator, and so forth. In one example, the agent material may be applied in the form of pellets, powder, a gel, a liquid, e.g., in droplet or aerosolized form, and so forth. The storage units 141 and 142 and the storage units 161 and 162 may be used/refilled with different materials, since the inclusion of VCSELs operating at multiple wavelengths in the printing device 100 may allow the use of different substrate materials and different agent materials that are responsive to different wavelengths of electromagnetic energy.

In one example, each of the VCSEL arrays 151 and 152 may include at least two VCSELs operable to output electromagnetic energy of at least two different wavelengths. In one example, VCSELs arrays 151 and 152 may include multiple VCSEL units. For instance, VCSEL arrays 151 and 152 may include a plurality of VCSELs arranged in grids of units, where each unit has one or more VCSELs for operating at several wavelengths. For illustrative purposes, two units 158 and 159 in the VCSEL array 151 are labeled in FIG. 1, where each of the units 158 and 159 may include six VCSELs. VCSEL arrays 151 and 152 may include additional units which, for ease of illustration, are not labeled. In one example, the six VCSELs in each of the units 158 and 159 may each operate at one of six different wavelengths. In another example, pairs of the VCSELs in each of the units 158 and 159 may operate at a same wavelength to provide three different possible wavelengths for each unit. For instance, a range of possible intensities for each wavelength may be increased by using two or more VCSELs operating at the same wavelength. In any event, using multiple VCSEL units, electromagnetic energy may be applied to multiple voxels at the same time as the first carriage 130 passes over the work area. In one example, VCSEL arrays 151 and 152 may extend across one dimension of the work area 110 such that electromagnetic energy may be applied by one of VCSEL arrays 151 and 152 to an entire row or column of a layer of the object 120 with the first carriage 130 moving in a perpendicular dimension. In another example, first carriage 130 may be of a smaller size and may not extend across any one dimension of the work area 110. In such an example, the first carriage 130 may move in two dimensions (e.g., both up/down and left/right) over the work area 110 (with directions indicated in reference to the example layout of FIG. 1). However, having multiple VCSEL units may allow the VCSEL arrays 151 and 152 to work multiple voxels at the same time, rather than voxel by voxel.

As mentioned above, in one example, each voxel of an object to be created may be characterized as a vector. For instance, a vector, V, representing an example voxel may include coordinates of the voxel in a three-dimensional space, e.g., variables x, y, and z, and magnitudes of color components, e.g., variables M, C, Y, W, B, representing magenta, cyan, yellow, white, and black, respectively, where V={x, y, z, M, C, Y, W, B}. In one example, the vector, V, representing the voxel may further include variables for substrate materials and/or agent materials to be deposited for the voxel, e.g., variables $A_1, A_2 \ldots A_n$, where n is the number of substrate and agent materials available in the printing device. Thus, the vector V may be expanded to take the form V={x, y, z, M, C, Y, W, B, $A_1, A_2 \ldots A_n$}. In addition, the vector V may further include variables for the intensities and/or durations of application of wavelengths of electromagnetic energy via one or more VCSELs of one or more VCSEL arrays of the printing device, e.g., variables $X_1, X_2 \ldots X_m$, where m is the number of different wavelengths available to be applied by a plurality of VCSELs. For instance vector V may be expanded to take the form $V=\{x, y, z, M, C, Y, W, B, A_1, A_2 \ldots A_n, X_1, X_2 \ldots X_m\}$, where for each of the variables X, $X_i=\{\lambda_i, I_i, D_i\}$, wherein $\lambda_i$ is the $i^{th}$ available wavelength, $I_i$ is the intensity for applying the $i^{th}$ wavelength $\lambda_i$ and $D_i$ is the duration for applying the $i^{th}$ wavelength $\lambda_i$. Thus, the wavelengths, intensities and/or duration of application of different wavelengths of electromagnetic energy are available to customize various visual and/or material properties of an object to be manufactured. In other words, the electromagnetic energy is not merely used as a heat source, e.g., for drying, curing, melting or fusing. Instead, the wavelengths, intensities and/or durations of application of electromagnetic energy may be selected based upon the substrate and agent materials that may be used and/or the desired property or properties to be exhibited by the finished object. For example, as mentioned above, such properties may relate to magnitudes or degrees of texture, porosity, rigidity, pliability, elasticity, strength, translucence, opacity, reflectivity, intensity, conductivity, chromaticity, and so forth.

In one example, the controller 170 may be provided with a set of instructions for manufacturing the object 120. For instance, the instructions may be received from a remote or an attached computing device via a communication interface of the printing device 100. In one example, the instructions may include a plurality of vectors, one for each of the voxels in the object 120. For each voxel, the controller 170 may forward the instructions or generate new instructions for VCSEL arrays 151 and 152, material coater 140, and/or the second carriage 160 to cause the application of selected quantities of substrate or agent materials for a particular voxel, to cause electromagnetic energy to be applied at one or more wavelengths at specified intensities and/or for specified durations, and so forth. In another example, the controller 170 may receive parameters for a voxel or for a region of the finished object, where the controller 170 may calculate a vector for each voxel based upon the parameters. For instance, the parameters may include a desired reflectivity and color for a region of the object 120. The controller 170 may therefore determine a combination of substrate and/or agent materials and one or more wavelengths, intensities, and/or durations of application of electromagnetic energy for each voxel based upon the parameters. In other words, the controller 170 may translate the parameters which specify one or more desired properties of an object into vector representations of a plurality of voxels. The controller 170 may then send the vectors, or relevant portions of the vectors to other components of the printing device 100 as instructions for the respective components.

In general, for each voxel, the controller 170 may therefore select at least one of the VCSELs for applying electromagnetic energy to the voxel and control an application of electromagnetic energy at a first wavelength to the voxel via the at least one VCSEL. For example, the controller 170 may select a wavelength, a duration and an intensity of the electromagnetic energy to apply to the voxel via the at least one of the VCSELs. The controller 170 may also select at least a second of the VCSELs for applying electromagnetic energy to the voxel and control an application of electromagnetic energy at the same wavelength or at a different/ second wavelength via the at least second VCSEL to the voxel. The controller 170 may further select at least one material for the voxel from a plurality of available materials, which may include one or more substrate/base materials for, and/or one or more agent materials.

FIG. 1 illustrates just one example of a printing device in which examples of the present disclosure may be implemented. Thus, it should be noted that the printing device 100 has been simplified. For example, the printing device 100 may include other elements (not shown) such as electromechanical switches to engage and disengage the first carriage 130 and second carriage 160, an input/output port, e.g., such as a serial input-output port, an Ethernet port, a uniform serial bus (USB) port, a wireless transceiver, or the like, a user interface and display, sensors deployed in work area 110, and so on. In addition, a printing device in which examples of the present disclosure may be implemented may further omit various elements, or include different elements according to the various types of printing device designs. As just one example, a printing device may alternatively feature a material coater and a unit for applying agent materials in an integrated carriage, with a separate carriage for one or more VCSEL arrays. In another example, a unit for applying agent materials and one or more VCSEL arrays may be deployed in an integrated carriage, with a separate carriage for a material water. In other examples, a material coater, a unit for applying functional agents, and one or more VCSEL arrays may be integrated into a single carriage or print head, or may be separated into three separate carriages or print heads. In still another example, additional storage units to store a greater number of base materials for the substrate and/or a greater number of different types of functional materials may be provided in printing device 100.

Other variations may also be implemented in accordance with the present disclosure. For example, voxels and layers of the object 120 may be described primarily in connection with a Cartesian system, e.g., rows, columns, layers, etc. However, in another example, a polar coordinate system in three dimensions, or in two of the three dimensions of physical space, may be used to address voxels of the object 120. Similarly, although VCSELs are described as being arranged into arrays and/or units, it should be noted that such terms are used to differentiate between various possible groupings of VCSELs in accordance with one example of the present disclosure. In other words, units of VCSELs may also be considered as "VCSEL arrays," VCSEL arrays 151 and 152 may be considered to be a single VCSEL array, even when laid-out as illustrated in FIG. 1, and so on. Thus, in examples of the present disclosure, VCSEL arrays can be arranged in different ways, such as a plurality of VCSEL arrays arranged in a line or staggered, a single VCSEL array or several VCSEL arrays contained in a moving carnage or bar, separate VCSEL arrays for emitting different wavelengths of light, one or more VCSELs emitting at different wavelengths interspersed in the same array, and so forth.

In one example, printing device 100 may represent a multi-jet fusion three-dimensional printer, e.g., where the second carriage 160 may comprise an inkjet printhead. However, in other examples of the present disclosure, a printing device may comprise an additive manufacturing device based upon a powder bed fusion technique, such as selective layer sintering (SLS), a binder jetting technique, a fused deposition modelling (FDM) technique, and so forth, any of which may utilize an array or arrays of VCSELs operating at different wavelengths to provide purposeful and deliberate variation of material and visual properties of various regions of a three-dimensional object to be manufactured. Thus, these and other examples are all contemplated within the scope of the present disclosure.

Figure 2:
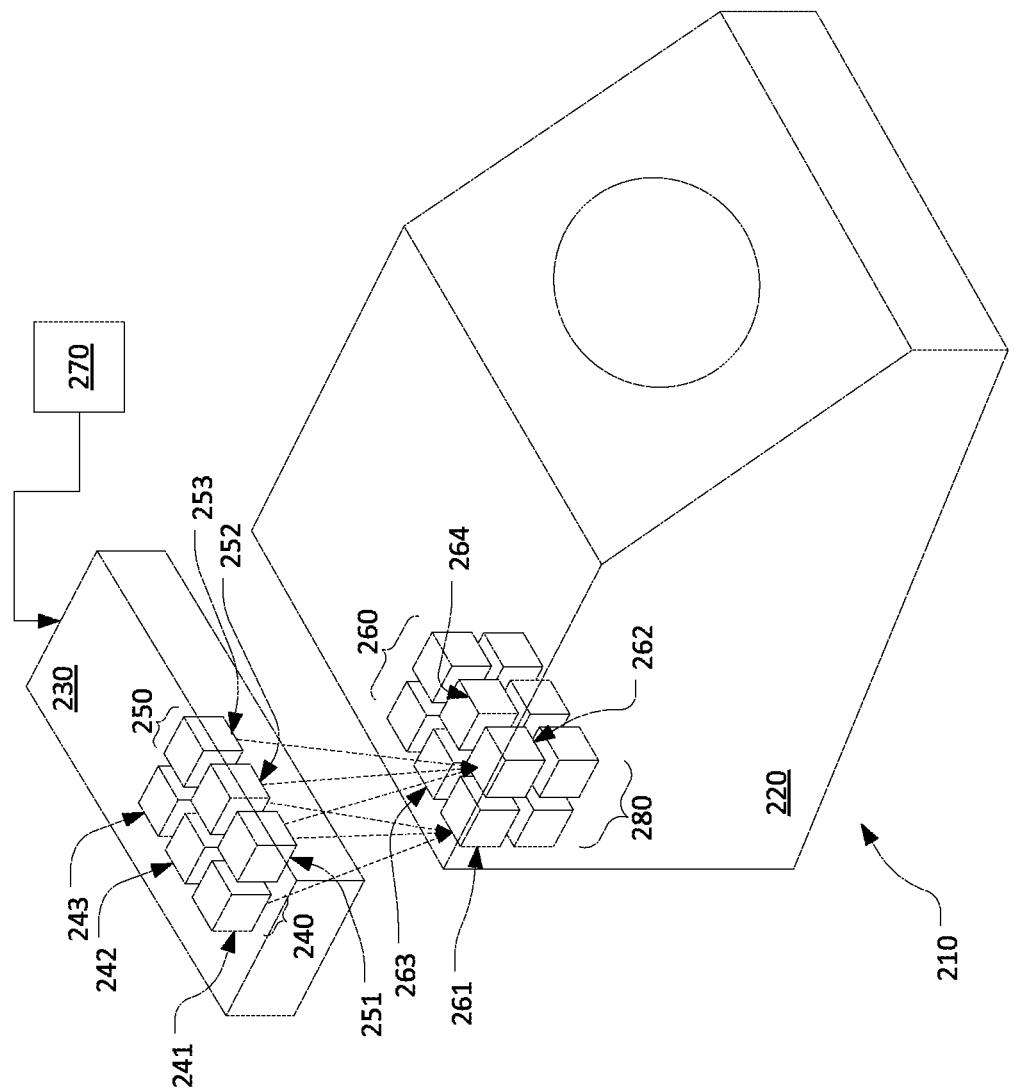
FIG. 2 illustrates an isometric view of one example of a printing or a manufacturing of a three-dimensional object by a printing device of the present disclosure.

FIG. 2 is an isometric view of one example of a printing or a manufacturing of a three-dimensional object by a printing device 200, in accordance with the present disclosure. In one example, printing device 200 may comprise the same or similar components to printing device 100 of FIG. 1. For example, device 200 may include a work surface 210 for manufacturing the object 220, a controller 270, and at least one VCSEL array 230, which may include one or more units of VCSELs. As illustrated in FIG. 2, VCSEL array 230 may include a unit 240 comprised of VCSELs 241-243 and a unit 250 comprised of VCSELs 251-252. In one example VCSELs 241-243 may operate at different respective wavelengths. Similarly, VCSELs 251-253 may operate at different respective wavelengths. In one example, VCSELs 241 and 251 may operate at a same first wavelength, VCSELs 242 and 252 may operate at a same second wavelength, and VCSELs 243 and 253 may operate at a same third wavelength. In one example, the respective units 240 and 250 are to apply electromagnetic energy to respective voxels of the three-dimensional object 220. For instance, unit 240 may be to apply electromagnetic energy to voxel 261 via one or more of VCSELs 241-242, while unit 250 may be to apply electromagnetic energy to voxel 262 via one or more of VCSELs 251-253, e.g., at the same time.

A portion of the voxels and layers of object 220 is illustrated in FIG. 2. For instance, layer 260 may include voxels 261-264. Other voxels are not shown and/or not labeled for ease of illustration. In the example of FIG. 2, the printing device 200 may have completed working on layer 280 and may currently be working on layer 260. For instance, controller 270 may send instructions to VCSEL array 230 to apply electromagnetic energy via zero, one or more than one of the VCSELs 241-243 in unit 240 to voxel 261. Similarly, controller 270 may send instructions to VCSEL array 230 to apply electromagnetic energy via zero, one or more than one of the VCSELs 251-243 in unit 250 to voxel 262. After the electromagnetic energy is applied (or not applied) to voxels 261 and 262 in accordance with the instructions, the VCSEL array 230 may move such that units 240 and 250 are positioned to apply electromagnetic energy to voxels 263 and 264 via the respective VCSELs 241-243 and 251-253 of each of the units 240 and 250 in accordance with further instructions from controller 270.

In one example, the controller 270 may receive parameters for a voxel or for a region of the object 220, where the controller 270 may calculate a vector for each voxel from the parameters. For instance, the parameters may include a desired reflectivity and color for a region of the object 220. The controller 270 may therefore determine a combination of substrate and/or agent materials and one or more wavelengths, intensities, and/or durations of application of electromagnetic energy for each voxel based upon the parameters. In other words, the controller 270 may translate the parameters which specify one or more desired properties of an object into vector representations of a plurality of voxels. However, even at the voxel level, predictability of the resulting material and visual properties may remain an issue. For example, substrate/base materials and/or agent materials may mix randomly, or may fail to mix uniformly such that application of electromagnetic energy at different wavelengths may result in a finished voxel with properties that deviate from a predicted result. In addition, while VCSEL resolution may be as fine as 10 microns or less, there may still be scattering of applied electromagnetic energy to adjacent voxels, including voxels in a layer, or several layers below a layer of the voxel where the electromagnetic energy from the VCSEL(s) is being applied. As such, the calculations of a vector for each voxel may take into account various conditions regarding a number of other voxels from a region of the object. For instance, if a particular duration and intensity of electromagnetic energy is calculated for being applied to a particular voxel, but it is anticipated that a certain amount of electromagnetic energy may scatter into the voxel when applied to other voxels nearby, the duration of application of electromagnetic energy from the VCSEL(s) to the particular voxel may be reduced such that the total quantity of electromagnetic energy sums the calculated quantity.

In one example, a number of test objects may be fabricated where numerous combinations of different substrate and/or agent materials and one or more wavelengths, intensities, and/or durations of application of electromagnetic energy are applied to voxels and/or regions of the test objects by one or more VCSEL arrays, and the resulting properties observed. From the data of the test objects, a knowledge base may be created such that desired material or visual properties of an object, a region of an object, or a voxel may be correlated to combinations of different substrate and/or agent materials and one or more wavelengths, intensities, and/or durations of application of electromagnetic energy that may be used individually or in various combinations to provide such properties.

It should be noted that FIG. 2 has been simplified. For example as mentioned above, printing device 200 may comprise the same or similar components as printing device 100 of FIG. 1. Thus, a material coater, a second carriage for applying agent material(s), additional VCSEL arrays, and so forth may also be contained in the printing device 200. In addition, device 200 may be expanded, modified, or may take a different form according to at least the foregoing variations and alternative configurations described above with respect to the example printing device 100 of FIG. 1.

Figure 3:
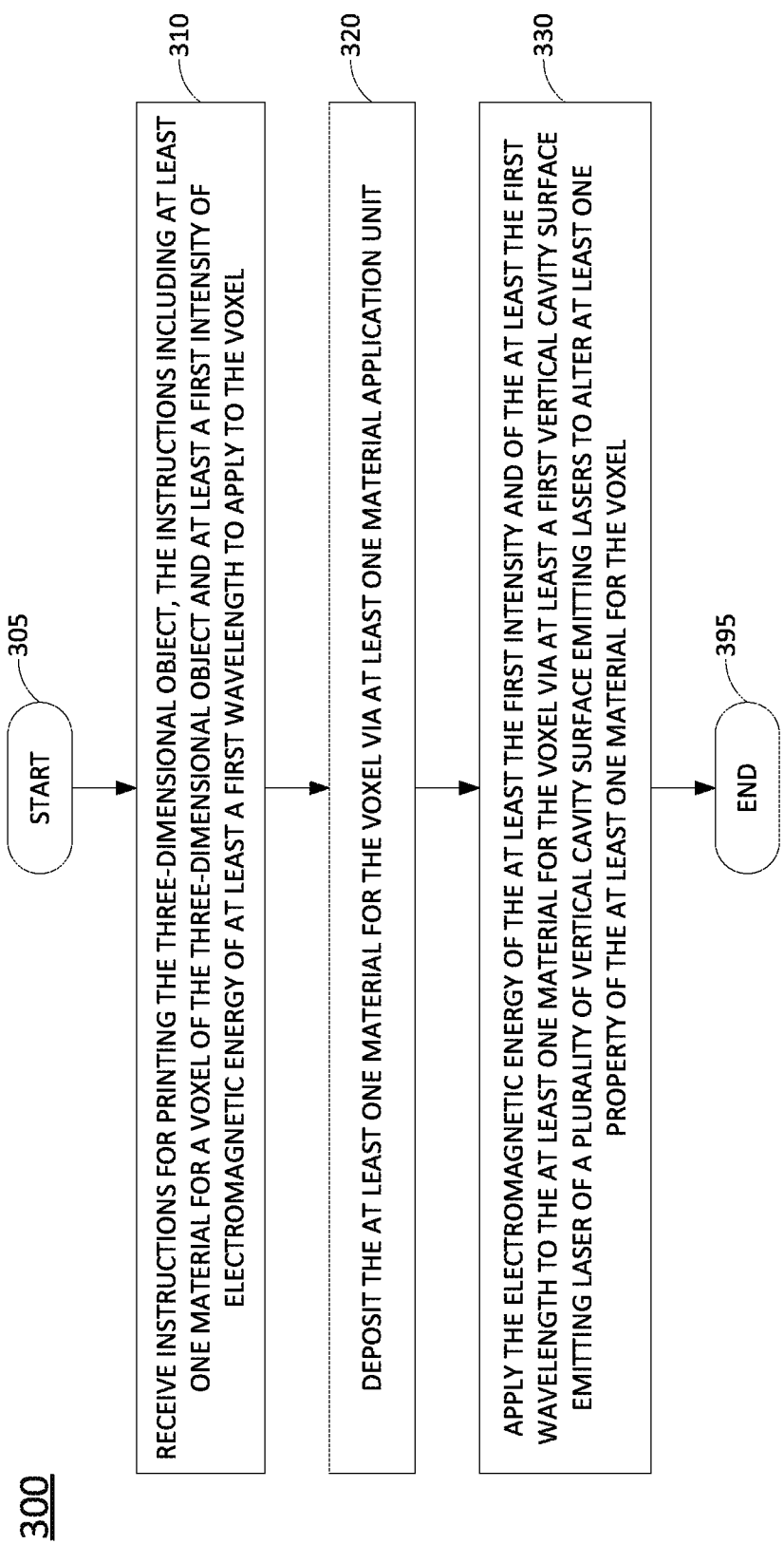
FIG. 3 illustrates a flowchart of an example method of the present disclosure for printing a three-dimensional object.

FIG. 3 illustrates a flowchart of an example method 300 for printing a three-dimensional object. The method 300 may be performed, for example, by any one or more of the components of the printing device 100 illustrated in FIG. 1. For instance, the method 300 may be performed by controller 170, or by controller 170 in coordination with the first carriage 130, second carriage 160, VCSEL arrays 151 and 152, material coater 140, and so forth. However, the method 300 is not limited to implementation with the printing device 100 of FIG. 1, but may be applied in connection with any number of types of additive manufacturing/printing devices having various configurations. Alternatively, or in addition, one or more blocks of the method 300 may be implemented by a printing device, e.g., a computing device having a processor, a memory, and input/output devices as illustrated below in FIG. 5, specifically programmed to perform the blocks of the method. Although any one or more of the elements of printing device 100 of FIG. 1 or a similar system may be configured to perform various blocks of the method 300, the method will now be described in terms of an example where blocks of the method are performed by a processor, such as processor 502 in FIG. 5. For example, processor 502 may comprise a processor of a printing device, or a processor of a controller of a printing device. It should be noted that where a processor is described as performing operations in connection with blocks of the method 300, the operations may comprise the processor itself performing the operations, or may comprise the processor performing the operations via one or more other elements in coordination by the processor.

The method 300 begins in block 305. In block 310, the processor may receive instructions for printing the three-dimensional object. The instructions may include at least one material for a voxel of the three-dimensional object and at least a first intensity of electromagnetic energy of at least a first wavelength to apply to the voxel. The at least one material may include at least one substrate material and/or at least one agent material for the voxel. In one example, the instructions may also include a duration of time to apply the electromagnetic energy of the at least the first wavelength to the at least one material for the voxel. In one example, the instructions may be received from a remote or an attached computing device via a communication interface of the printing device. In one example, the instructions may include a plurality of vectors as described above, e.g., one for each of the voxels in the object. It should be noted that multiple wavelengths of energy may be included in the instructions for applying to the voxel. The instructions may further include material(s) and/or wavelengths, intensities and/or durations of application of electromagnetic energy for one or more additional voxels of the three-dimensional object. It should be noted that for some voxels, the instructions may specify that no electromagnetic energy is to be applied. However, the present method 300 is described in connection with an example where electromagnetic energy of at least a first wavelength is be applied to the voxel.

In block 320, the processor may deposit the at least one material for the voxel via at least one material application unit. As mentioned above, the at least one material may comprise at least one substrate material and/or at least one agent material. Thus, in one example, the at least one material application unit may comprise a material coater or curing bar, a carriage for applying one or more agent materials, e.g., an inkjet printhead, and so forth. In one example, block 320 may comprise the processor causing a material application unit, or multiple material application units to pass over a work area of the printing device to deposit one or more materials for the voxel. For example, the processor may send a vector characterizing the voxel, or relevant portions of the vector as instructions for the at least one material application unit. Alternatively, or in addition, the processor may translate the vector into further instructions in one or more formats suitable for the at least one material application unit. The at least one material may be applied in the form of pellets, powder, a gel, a liquid, e.g., in droplet or aerosolized form, and so forth, depending upon the nature of the material(s) available to the printing device.

In block 330, the processor may apply the electromagnetic energy of the at least the first intensity and of the at least the first wavelength to the at least one material for the voxel via at least a first VCSEL of a plurality of VCSELs. The application of the electromagnetic energy of the at least the first intensity and of the at least the first wavelength may be to alter at least one property of the at least one material for the voxel. For example, the processor may send a vector characterizing the voxel, or relevant portions of the vector as instructions for the at least one VCSEL. Alternatively, or in addition, the processor may translate the vector into further instructions in one or more formats suitable for the at least one VCSEL. The at least one property may comprise a material property or a visible property, such as: texture, porosity, rigidity, pliability, elasticity, strength, translucence, opacity, reflectivity, intensity, conductivity, chromaticity, and so forth. The alteration of the at least one property may comprise heating, drying, curing, melting, or fusing, as well as additional transformations, such as plasticization, polymerization or other chemical changes. In one example, the plurality of VCSELs may include multiple VCSELs to emit at the first wavelength. Accordingly, in one example, the at least the first intensity may be provided by applying two or more VCSELs emitting at the same wavelength to the voxel. However, in another example, the intensity of electromagnetic energy output by an individual VCSEL may be adjustable. In addition, the plurality of VCSELs may further include at least a second VCSEL to emit electromagnetic energy at a second wavelength, at least a third VCSEL to emit electromagnetic energy at a third wavelength, and so on. Additional VCSELs operating at different wavelengths may therefore be applied to the same voxel or to different voxels of the three-dimensional object that is being created. In one example, the electromagnetic energy of the at least the first intensity and of the at least the first wavelength is applied by the processor to the at least the first material in a plurality of voxels to create a first region of the three-dimensional object, where the electromagnetic energy of the at least the first intensity and of the at least the first wavelength is not applied to a second region of the three-dimensional object. In other words, different regions with different properties may be created in the same three-dimensional object by using different profiles for the application of electromagnetic energy through one or more VCSELs for the different regions. Following block 330, the method 300 may proceed to block 395 where the method ends.

It should be noted that in one example, the blocks of the method 300 may be repeated for subsequent voxels of a three-dimensional object, or the method 300 may be performed in parallel for different voxels. For instance, the three-dimensional object may be printed layer by layer, e.g., where substrate materials for a next layer are not deposited until all or at least a portion of the previous layer has been finished.

Figure 4:
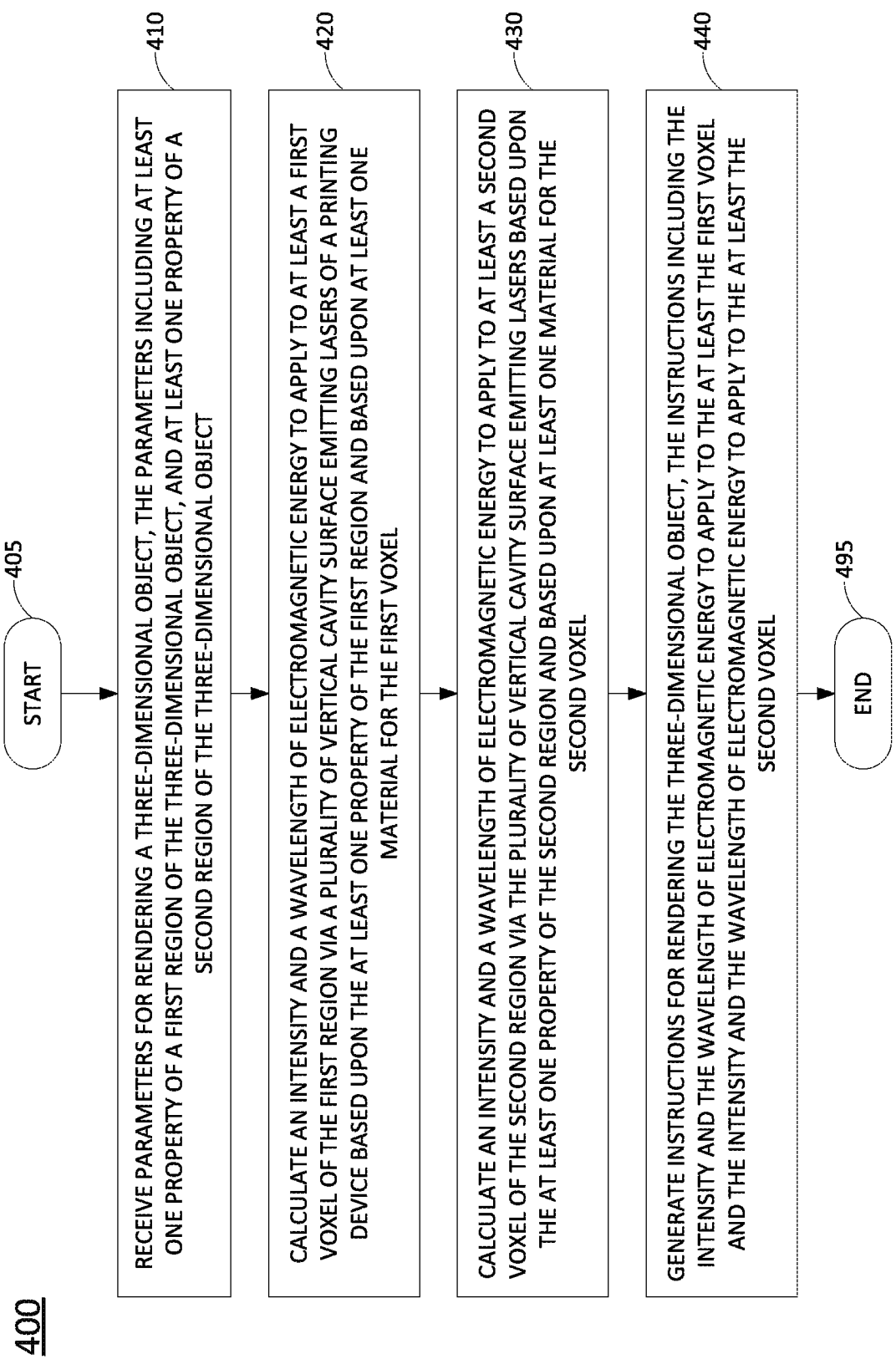
FIG. 4 illustrates an additional flowchart of an example method of the present disclosure for generating instructions for rendering three-dimension object.

FIG. 4 illustrates a flowchart of an example method 400 for generating instructions for rendering a three-dimensional object. The method 400 may be performed, for example, by any one or more of the components of the printing device 100 illustrated in FIG. 1. For instance, the method 400 may be performed by controller 170. Alternatively, or in addition, one or more blocks of the method 400 may be implemented by a computing device having a processor, a memory, and input/output devices as illustrated below in FIG. 5, specifically programmed to perform the blocks of the method. For instance, the method 400 may be performed by a computing device attached to or remotely connected to an additive manufacturing/printing device. For illustrative purposes, the method will now be described in terms of an example where blocks of the method are performed by a processor, such as processor 502 in FIG. 5. It should be noted that where a processor is described as performing operations in connection with blocks of the method 400, the operations may comprise the processor itself performing the operations, or may comprise the processor performing the operations via one or more other elements in coordination by the processor.

The method 400 begins in block 405. In block 410, the processor may receive parameters for rendering a three-dimensional object, the parameters including at least one property of a first region of the three-dimensional object and at least one property of a second region of the three-dimensional object. The first region may include at least a first voxel and the second region may include at least a second voxel. In one example, the parameters may be input by a user of the computing device. In another example, the parameters may be received from another attached or remote computing device.

In block 420, the processor may calculate an intensity and a wavelength of electromagnetic energy to apply to the at least the first voxel via a plurality of VCSELs of a printing device based upon the at least one property of the first region and based upon at least one material for the first voxel. For instance, the parameters may include a desired reflectivity and a color for the first region of the object. The processor may therefore determine a combination of substrate and/or agent materials and one or more wavelengths, intensities, and/or durations of application of electromagnetic energy calculated to result in the desired parameter(s) for the for the first voxel. For instance, a more reflective surface may call for an exposure of a particular substrate material to UV light. In addition, in one example, the substrate material and/or an agent material may be most responsive to a particular wavelength or band of electromagnetic energy, which may be factored into the calculation by the processor. Other example properties that may be set forth in the parameters may include a magnitude or degree of texture, porosity, rigidity, elasticity, strength, translucence, opacity, reflectivity, intensity, conductivity, chromaticity, and so forth.

In one example, the at least one material may be specifically identified in the parameters. For instance, a user may desire to print only a nylon-based three-dimensional object. Therefore, the processor may be constrained in selecting agent materials and/or one or more wavelengths, intensities, and/or durations of application of electromagnetic energy calculated to result in the desired parameter(s) for the for the first voxel, given the fixed variable of the substrate material (e.g., nylon). In another example, the parameters may describe a general property of the first voxel and/or the first region, where the processor is tasked with selecting one or more wavelengths, intensities, and/or durations of application of electromagnetic energy, one or more base/substrate materials, and/or one or more agent materials that may be available in a printing device to achieve the desired property for the first voxel. In still another example, a printing device may be known to have just one available substrate material. Thus, the processor may calculate the wavelengths, intensities, and/or durations of application of electromagnetic energy based upon the parameters received at block 410, taking into account the fixed variable of substrate material.

In block 430 the processor may calculate an intensity and a wavelength of electromagnetic energy to apply to the at least the second voxel via the plurality of VCSELs based upon the at least one property of the second region and based upon at least one material for the second voxel. For instance, the parameters may include a desired reflectivity and color for the second region of the object, a desired pliability, and so forth. The processor may therefore determine a combination of substrate and/or agent materials and one or more wavelengths, intensities, and/or durations of application of electromagnetic energy calculated to result in the desired property, or properties, for the for the second voxel, including incorporating into the calculation the likely effects of dispersion or reflection of agents and energy from the production or properties of adjacent voxels in previous, current, or successive printed layers. The operations of block 430 may comprise the same or similar operations to those described above in connection with block 420.

In block 440, the processor may generate instructions for rendering the three-dimensional object, the instructions including the intensity and the wavelength of electromagnetic energy to apply to the at least the first voxel and the intensity and the wavelength of electromagnetic energy to apply to the at least the second voxel. In one example, the instructions may comprise vector representations of the at least the first voxel and the at least the second voxel. Example vector representations of a voxel are described above, Thus, through the method 400, the processor may translate the parameters which specify one or more desired properties of an object into vector representations of a plurality of voxels. The vector representations may then be used as further instructions for one or more components of a printing device to create the three-dimensional object.— Following block 440, the method 400 may proceed to block 495 where the method ends.

In addition, although not explicitly specified, one or more blocks, functions, or operations of the methods 300 and 400 described above may include storing, displaying, and/or outputting. In other words, any data, records, fields, and/or intermediate results discussed in the methods can be stored, displayed, and/or outputted to another device depending on the particular application. Furthermore, blocks, functions, or operations in FIGS. 3 and 4 that recite a determining operation, or involve a decision, do not necessarily imply that both branches of the determining operation are practiced. In other words, one of the branches of the determining operation can be deemed as optional. In addition, various blocks of the respective methods 300 and 400 may be considered optional in various examples. In addition, it should be noted that the respective methods 300 and 400 may also be expanded to include additional operations and functions as described above in connection with various examples.

Figure 5:
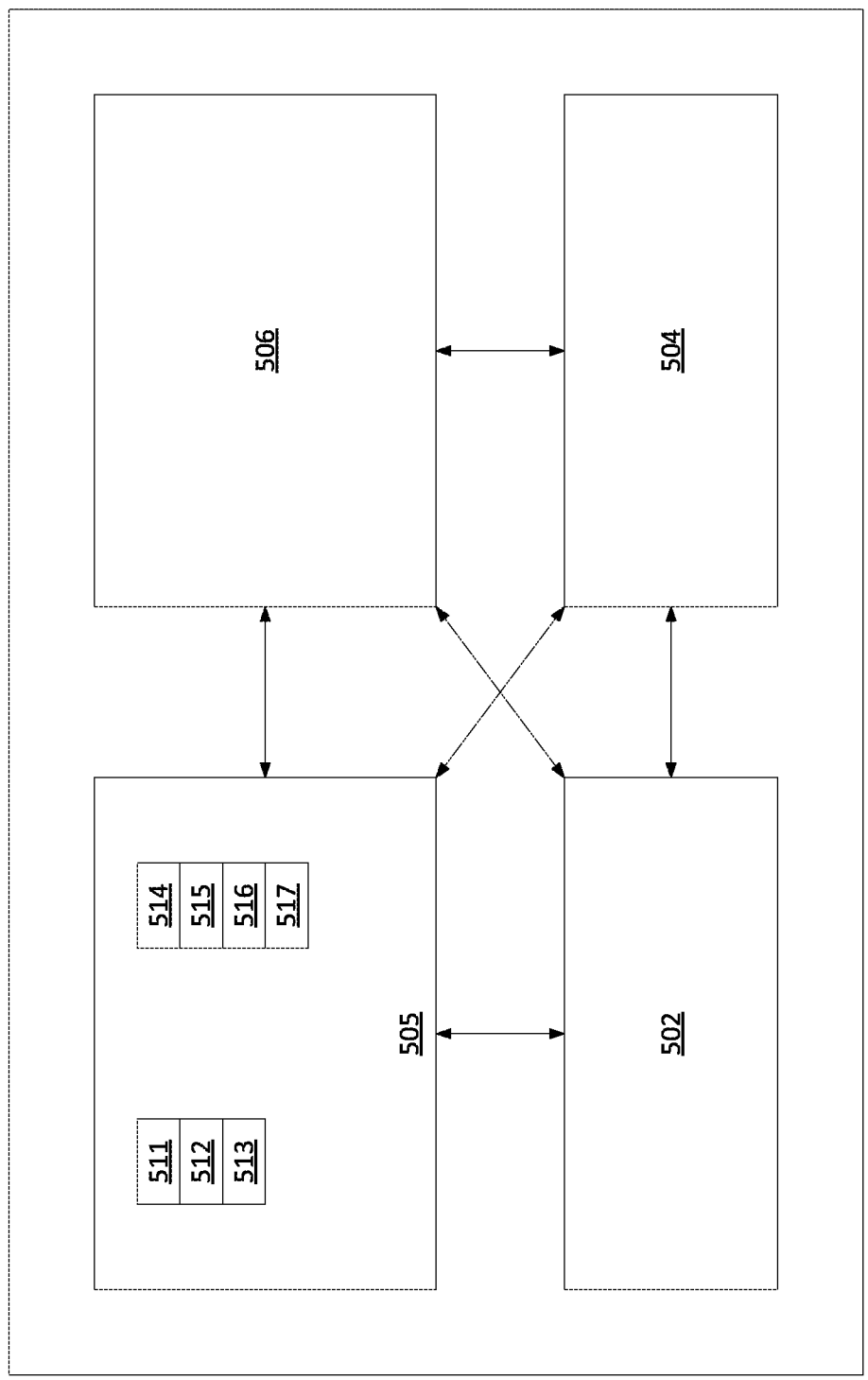
FIG. 5 depicts a high-level block diagram of an example computer that can be transformed into a machine capable of performing the functions described herein.

FIG. 5 depicts an example high-level block diagram of a computing device suitable for use in performing the functions of a printing device as described herein. As depicted in FIG. 5, the computer 500 comprises a hardware processor element 502, e.g., a central processing unit (CPU), a microprocessor, or a multi-core processor, a memory 504, e.g., random access memory (RAM), a component 505 for printing a three-dimensional object or for generating instructions for rendering a three-dimensional object, and various input/output devices 506, e.g., storage devices, including but not limited to, a tape drive, a floppy drive, a hard disk drive or a compact disk drive, a receiver, a transmitter, a speaker, a display, a speech synthesizer, an output port, an input port and a user input device, such as a keyboard, a keypad, a mouse, a microphone, and the like. Although one processor element is shown, it should be noted that the computer may employ a plurality of processor elements. Furthermore, although one computer is shown in the figure, if the method(s) as discussed above is implemented in a distributed or parallel manner for a particular illustrative example, i.e., the blocks of the above method(s) or the entire method(s) are implemented across multiple or parallel computers, then the computer of this figure is intended to represent each of those multiple computers.

It should be noted that the present disclosure can be implemented by machine readable instructions and/or in a combination of machine readable instructions and hardware, e.g., using application specific integrated circuits (ASIC), a programmable logic array (PLA), including a field-programmable gate array (FPGA), or a state machine deployed on a hardware device, a computer or any other hardware equivalents, e.g., computer-readable instructions pertaining to the method(s) discussed above can be used to configure a hardware processor to perform the blocks, functions and/or operations of the above disclosed methods.

In one example, instructions and data for the present component or process 505 for printing a three-dimensional object or for generating instructions for rendering a three-dimensional object, e.g., machine readable instructions, can be loaded into memory 504 and executed by hardware processor element 502 to implement the blocks, functions, or operations as discussed above in connection with the example methods 300 and 400. For instance, in one example, the component 505 may include a plurality of computer-readable components, including a receiving, instructions component 511, a depositing materials component 512, and an applying electromagnetic energy component 513. When executed by the hardware processor element 502, the receiving instructions component 511 may cause the hardware processor element 502 to receive instructions for rendering a three-dimensional object, the depositing materials component 512 may cause the hardware processor element 502 to deposit at least one material for a voxel of the three-dimensional object via at least one material application unit, and the applying electromagnetic energy component 513 may cause the hardware processor element 502 to apply electromagnetic energy of at least a first intensity and of at least a first wavelength to the at least one material for the voxel via at least a first VCSEL of a plurality of VCSELs. For example, the foregoing configuration of component 505 may cause the hardware processor element 502 and/or the computing device of FIG. 5 to perform the functions of a printing device of the present disclosure, e.g., according to the example method 300. In another example, the component 505 may include a plurality of computer-readable components, including a receiving parameters component 514, a first calculating an intensity and a wavelength of electromagnetic energy component 515, a second calculating an intensity and a wavelength of electromagnetic energy component 516, and a generating instructions for rendering a three-dimensional object component 517. When executed by the hardware processor element 502, the receiving parameters component 514 may cause the hardware processor element 502 to receive parameters for rendering a three-dimensional object, the first calculating an intensity and a wavelength of electromagnetic energy component 515 may cause the hardware processor element 502 to calculate an intensity and a wavelength of electromagnetic energy to apply to at least a first voxel of a first region of the three-dimensional object, the second calculating an intensity and a wavelength of electromagnetic energy component 516 may cause the hardware processor element 502 to calculate an intensity and a wavelength of electromagnetic energy to apply to at least a second voxel of a second region of the three-dimensional object, and the generating instructions for rendering a three-dimensional object component 517 may cause the hardware processor element 502 to generate instructions for rendering the three-dimensional object, the instructions including the intensity and the wavelength of electromagnetic energy to apply to the at least the first voxel and the intensity and the wavelength of electromagnetic energy to apply to the at least the second voxel. For example, the foregoing configuration of component 505 may cause the hardware processor element 502 and/or the computing device of FIG. 5 to perform the functions of a printing device, or a computing device attached, to or remotely connected to a printing device for rendering a three-dimensional object, e.g., according to the example method 400. Additional configurations of component 505 may be provided in accordance with various other examples the present disclosure.

Furthermore, when a hardware processor executes instructions to perform "operations," this could include the hardware processor performing the operations directly and/or facilitating, directing, or cooperating with another hardware device or component, e.g., a co-processor and the like, to perform the operations.

The processor executing the machine readable instructions relating to the above described method(s) can be perceived as a programmed processor or a specialized processor. As such, the present component 505 for printing a three-dimensional object or for generating instructions for rendering a three-dimensional object, including associated data structures, of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. Furthermore, the computer-readable storage device may comprise any physical device or devices that provide the ability to store information such as data and/or instructions to be accessed by a processor or a computing device such as a computer or an application server.

It will be appreciated that variants of the above-disclosed and other features and functions, or alternatives thereof, may be combined into many other different systems or applications. Various presently unforeseen or unanticipated alternatives, modifications, or variations therein may be subsequently made, which are also intended to be encompassed by the following claims.

What is claimed is:

1. A device for printing a three-dimensional object, the device comprising:
    at least one material application unit to deposit at least one material for each voxel of the three-dimensional object;
    a vertical cavity surface emitting laser array comprising a plurality of vertical cavity surface emitting lasers, the plurality of vertical cavity surface emitting lasers including a first vertical cavity surface emitting laser to operate at a first wavelength and a second vertical cavity surface emitting laser to operate at a second, different wavelength; and
    a processor to control the material application unit and independently control each laser in the laser array, the processor programmed to receive a vector corresponding to one particular voxel, the vector including values describing properties or processing of the corresponding voxel, the processor to parse the values of the vector to determine parameters for forming the corresponding voxel and control a deposition of the at least one material for the corresponding voxel via the at least one material application unit and control an application of electromagnetic energy to the corresponding voxel according to the parameters of the vector for that specific corresponding voxel using at least one of the first vertical cavity surface emitting laser or the second vertical cavity surface emitting laser to alter at least one property of the at least one material of the corresponding voxel.

2. The device of claim 1, wherein the vector specifies an intensity of the electromagnetic energy to apply to the voxel corresponding to the vector.

3. The device of claim 1, wherein the vector specifies a wavelength of the electromagnetic energy to apply to the voxel corresponding to the vector.

4. The device of claim 1, wherein the vector specifies a duration of the electromagnetic energy to apply to the voxel corresponding to the vector.

5. The device of claim 1, wherein the vector specifies which of multiple different materials available are deposited at the corresponding voxel.

6. The device of claim 1, wherein, using the parameters of the vector, the processor is to control an application of the electromagnetic energy at the first wavelength to the corresponding voxel via the first vertical cavity surface emitting laser and to control an application of the electromagnetic energy at the second wavelength via the second vertical cavity surface emitting laser to the same corresponding voxel.

7. The device of claim 1, further comprising:
a plurality of storage units storing a plurality of materials, wherein the processor is to select the at least one material for the voxel from the plurality of materials, and to select at least one of the first vertical cavity surface emitting laser or the second vertical cavity surface emitting laser for applying the electromagnetic energy to the voxel.

8. The device of claim 1, wherein the vector specifies for the processor a wavelength, a duration, and an intensity of the electromagnetic energy to apply to the corresponding voxel via at least one of: the first vertical cavity surface emitting laser or the second vertical cavity surface emitting laser, to alter at least one property of the at least one material.

9. The device of claim 1, wherein, for a voxel that is adjacent to the one particular voxel, the processor is further to account for an effect on the adjacent voxel of the electromagnetic energy to be applied to the one particular voxel when the processor is implementing processing parameters for the adjacent voxel.

10. The device of claim 1, wherein the processor is programmed to parse the vector by translating values from the vector that specify one or more desired properties of the object into parameters for forming the corresponding voxel or by selecting a relevant portion of the vector to forward to the material application unit or VSCEL array.

11. A method of printing a three-dimensional object, the method comprising:
receiving, by a printing device, instructions for printing the three-dimensional object, the instructions including at least one material for a voxel of the three-dimensional object, and at least a first intensity of electromagnetic energy of at least a first wavelength to apply to the voxel;
depositing, by the printing device, the at least one material for the voxel via at least one material application unit; and
using the received instructions, for each voxel of the object individually and independently, applying, by the printing device, the electromagnetic energy of at least the first intensity and of at least the first wavelength to the at least one material for the voxel via at least a first vertical cavity surface emitting laser of a plurality of vertical cavity surface emitting lasers to alter at least one property of the at least one material for the voxel, wherein the plurality of vertical cavity surface emitting lasers includes at least a second vertical cavity surface emitting laser to emit electromagnetic energy at a second wavelength.

12. The method of claim 11, wherein the at least one material is selected from a plurality of materials stored by the printing device.

13. The method of claim 11, wherein the at least one property comprises a visual property or a material property.

14. The method of claim 11, wherein the electromagnetic energy of at least the first intensity and of at least the first wavelength is applied by the processor to at least the first material in a plurality of voxels to create a first region of the three-dimensional object, wherein the electromagnetic energy of at least the first intensity and of at least the first wavelength is not applied to a second region of the three-dimensional object.

15. The method of claim 11, further comprising, when using the received instructions, accounting for an effect on an adjacent voxel of the electromagnetic energy to be applied to the voxel when setting processing parameters for the adjacent voxel.

16. The method of claim 11, further comprising, in the instructions, specifying an intentional non-uniformity in the physical properties of different regions of one or more voxels of the object.

17. The method of claim 11, further comprising, in the instructions, specifying a first region of the object with a different physical characteristic from a second region of the object by changing parameters to be used when forming voxels in the first region as compared to voxels in the second region.

18. A non-transitory computer-readable medium storing instructions which, when executed by a processor, cause the processor to:
receive parameters for rendering a three-dimensional object, the parameters including at least one property of a first region of the three-dimensional object, and at least one property of a second region of the three-dimensional object, the first region including at least a first voxel and the second region including at least a second voxel;
calculate an intensity and a wavelength of electromagnetic energy to apply to at least the first voxel via a plurality of vertical cavity surface emitting lasers of a printing device based upon the at least one property of the first region and based upon at least one material for the first voxel;
calculate an intensity and a wavelength of electromagnetic energy to apply to at least the second voxel via the plurality of vertical cavity surface emitting lasers based upon the at least one property of the second region and based upon at least one material for the second voxel; and
generate instructions for rendering the three-dimensional object, the instructions including the intensity and the wavelength of electromagnetic energy to apply to at least the first voxel and the intensity and the wavelength of electromagnetic energy to apply to at least the second voxel.

19. The non-transitory computer-readable medium of claim 18, wherein the at least one material for the first voxel is different from the at least one material for the second voxel.

20. The non-transitory computer-readable medium of claim 18, wherein a distance between a center of the first voxel and a center of an adjacent voxel of the three-dimensional object is less than 20 microns.

* * * * *